(12) United States Patent
Wang et al.

(10) Patent No.: US 10,971,102 B2
(45) Date of Patent: Apr. 6, 2021

(54) SHIFT REGISTER UNIT AND DRIVING METHOD, GATE DRIVING CIRCUIT, AND DISPLAY DEVICE

(71) Applicants: Hefei BOE Optoelectronics Technology Co., Ltd., Anhui (CN); BOE Technology Group Co., Ltd., Beijing (CN)

(72) Inventors: Ying Wang, Beijing (CN); Meng Li, Beijing (CN); Hongmin Li, Beijing (CN)

(73) Assignees: Hefei BOE Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/634,394

(22) PCT Filed: Nov. 14, 2018

(86) PCT No.: PCT/CN2018/115370
§ 371 (c)(1),
(2) Date: Jan. 27, 2020

(87) PCT Pub. No.: WO2020/097816
PCT Pub. Date: May 22, 2020

(65) Prior Publication Data
US 2021/0074234 A1 Mar. 11, 2021

(51) Int. Cl.
*G09G 3/36* (2006.01)
*G11C 19/28* (2006.01)

(52) U.S. Cl.
CPC ........... *G09G 3/3677* (2013.01); *G11C 19/28* (2013.01); *G09G 2310/0286* (2013.01)

(58) Field of Classification Search
CPC ......... G09G 3/3677; G09G 2310/0286; G11C 19/28; G11C 19/00
See application file for complete search history.

(56) References Cited

U.S. PATENT DOCUMENTS 7,436,923 B2 * 10/2008 Tobita .................. G09G 3/3677
377/64
9,324,288 B1 * 4/2016 Dai ....................... G09G 3/3677
(Continued)

FOREIGN PATENT DOCUMENTS

CN 106024065 A 10/2016
CN 106486082 A 3/2017
(Continued)

*Primary Examiner* — Sardis F Azongha
(74) *Attorney, Agent, or Firm* — Banner & Witcoff, Ltd.

(57) ABSTRACT

A shift register unit, a gate driving circuit, a display device, and a driving method are provided. The shift register unit includes an input circuit, an output circuit, a first node control circuit, and a second node control circuit. The input circuit is configured to provide an input signal to a first node in response to a first control signal; the output circuit is configured to output an output signal at an output terminal under control of a level of the first node; the first node control circuit is configured to reset the first node under control of a level of a second node; and the second node control circuit is connected to the second node, and is configured to provide a third control signal to the second node in response to a second control signal to control the level of the second node.

20 Claims, 6 Drawing Sheets

(56) References Cited

U.S. PATENT DOCUMENTS

| | | | |
|---|---|---|---|
| 10,170,069 B2 | 1/2019 | Xue et al. | |
| 2015/0015562 A1 | 1/2015 | Han et al. | |
| 2020/0042153 A1 | 2/2020 | Yang | |
| 2020/0051507 A1 | 2/2020 | Feng et al. | |

FOREIGN PATENT DOCUMENTS

| | | | |
|---|---|---|---|
| CN | 108711401 A | 10/2018 | |
| CN | 108766340 A | 11/2018 | |
| CN | 108806628 A | 11/2018 | |

\* cited by examiner

SHIFT REGISTER UNIT AND DRIVING METHOD, GATE DRIVING CIRCUIT, AND DISPLAY DEVICE

The application is a U.S. National Phase Entry of International Application No. PCT/CN2018/115370 filed on Nov. 14, 2018, designating the United States of America. The present application claims priority to and the benefit of the above-identified application and the above-identified application is incorporated by reference herein in its entirety.

TECHNICAL FIELD

The embodiments of the present disclosure relate to a shift register unit and a driving method, a gate driving circuit, and a display device.

BACKGROUND

In a field of display technology, for example, a pixel array of a liquid crystal display (LCD) panel or an organic light-emitting diode (OLED) display panel generally includes a plurality rows of gate lines and a plurality of columns of data lines interlaced the plurality rows of gate lines. The plurality rows of gate lines can be driven by a bonded integrated driving circuit. In recent years, with the continuous improvement of the manufacturing process of amorphous silicon thin film transistors or oxide thin film transistors, a gate line driving circuit can also be directly integrated on a thin film transistor array substrate to form a gate driver on array (GOA) to drive the gate lines. For example, a GOA including a plurality of cascaded shift register units can be used to provide switching voltage signals (scan signals) for the plurality of rows of gate lines of the pixel array, for example, to control the plurality of rows of gate lines to be turned on sequentially, and simultaneously, the data lines provide data signals to corresponding rows of pixel units in the pixel array to form the gray voltages required for the respective gray levels of a display image at the respective pixel units, thereby displaying a frame of image. Currently, GOA technology is increasingly used in display panels to drive the gate lines. The GOA technology helps to achieve a narrow frame design of the display panel and can reduce a production cost of the display panel.

SUMMARY

At least one embodiment of the present disclosure provides a shift register unit, and the shift register unit comprises an input circuit, an output circuit, a first node control circuit, and a second node control circuit. The input circuit is connected to a first node, and is configured to provide an input signal to the first node in response to a first control signal; the output circuit is connected to the first node and an output terminal, and is configured to output an output signal at the output terminal under control of a level of the first node; the first node control circuit is connected to the first node and a second node, and is configured to reset the first node under control of a level of the second node; and the second node control circuit is connected to the second node, and is configured to provide a third control signal to the second node in response to a second control signal to control the level of the second node.

For example, in the shift register unit provided by an embodiment of the present disclosure, the input circuit comprises a first transistor, a gate electrode of the first transistor is connected to a first clock signal terminal to receive a first clock signal as the first control signal, a first electrode of the first transistor is connected to an input terminal to receive the input signal, and a second electrode of the first transistor is connected to the first node.

For example, in the shift register unit provided by an embodiment of the present disclosure, the second node control circuit comprises a first control sub-circuit and a second control sub-circuit; the first control sub-circuit is connected to a third node, and is configured to control a level of the third node in response to a second clock signal which serves as the second control signal; and the second control sub-circuit is connected to the second node and the third node, and is configured to output the third control signal to the second node under control of the level of the third node.

For example, in the shift register unit provided by an embodiment of the present disclosure, the third control signal comprises a third clock signal.

For example, in the shift register unit provided by an embodiment of the present disclosure, the first control sub-circuit comprises a second transistor; a gate electrode and a first electrode of the second transistor are electrically connected to each other, and are respectively configured to be connected to a second clock signal terminal to receive the second clock signal as the second control signal, and a second electrode of the second transistor is connected to the third node.

For example, in the shift register unit provided by an embodiment of the present disclosure, the second control sub-circuit comprises a third transistor and a first capacitor; a gate electrode of the third transistor is connected to the third node, a first electrode of the third transistor is connected to a third clock signal terminal to receive the third clock signal as the third control signal, and a second electrode of the third transistor is connected to the second node; and a first terminal of the first capacitor is connected to the second node, and a second terminal of the first capacitor is connected to the third node.

For example, in the shift register unit provided by an embodiment of the present disclosure, the second node control circuit further comprises a third node reset sub-circuit, the third node reset sub-circuit is connected to the third node, and is configured to reset the third node in response to a reset signal.

For example, in the shift register unit provided by an embodiment of the present disclosure, the third node reset sub-circuit comprises a fourth transistor, a gate electrode of the fourth transistor is connected to a reset terminal to receive the reset signal, a first electrode of the fourth transistor is connected to the third node, and a second electrode of the fourth transistor is connected to a reference voltage terminal to receive a reference voltage.

For example, in the shift register unit provided by an embodiment of the present disclosure, under control of the level of the first node, the output circuit outputs the second clock signal as the output signal at the output terminal.

For example, in the shift register unit provided by an embodiment of the present disclosure, the output terminal comprises a shift output terminal and at least one scan signal output terminal.

For example, in the shift register unit provided by an embodiment of the present disclosure, the output circuit comprises a fifth transistor, a sixth transistor, and a second capacitor; a gate electrode of the fifth transistor is connected to the first node, a first electrode of the fifth transistor is connected to a second clock signal terminal to receive the second clock signal as the output signal, and a second electrode of the fifth transistor is connected to the shift output terminal; a gate electrode of the sixth transistor is connected to the first node, a first electrode of the sixth transistor is connected to the second clock signal terminal to receive the second clock signal as the output signal, and a second electrode of the sixth transistor is connected to the scan signal output terminal; and a first terminal of the second capacitor is connected to the first node, and a second terminal of the second capacitor is connected to the shift output terminal or the scan signal output terminal.

For example, in the shift register unit provided by an embodiment of the present disclosure, the first node control circuit comprises a seventh transistor, a gate electrode of the seventh transistor is connected to the second node, a first electrode of the seventh transistor is connected to the first node, and a second electrode of the seventh transistor is connected to a reference voltage terminal to receive a reference voltage.

For example, the shift register unit provided by an embodiment of the present disclosure further comprises an output noise reduction circuit. The output noise reduction circuit is connected to the second node and the output terminal, and is configured to perform noise reduction on the output terminal under control of the level of the second node.

For example, the shift register unit provided by an embodiment of the present disclosure further comprises a main reset circuit. The main reset circuit is connected to the first node and is configured to reset the first node under control of a reset signal.

At least one embodiment of the present disclosure also provides a gate driving circuit, and the gate driving circuit comprises a plurality of cascaded shift register units according to any one of the embodiments of the present disclosure.

For example, the gate driving circuit provided by an embodiment of the present disclosure further comprises a first clock signal line, a second clock signal line, and a third clock signal line, the shift register unit further comprises a first clock signal terminal, a second clock signal terminal, and a third clock signal terminal. The first clock signal terminal of a (3N+1)-th stage of shift register unit is connected to the first clock signal line, the second clock signal terminal of the (3N+1)-th stage of shift register unit is connected to the second clock signal line, and the third clock signal terminal of the (3N+1)-th stage of shift register unit is connected to the third clock signal line; the first clock signal terminal of a (3N+2)-th stage of shift register unit is connected to the second clock signal line, the second clock signal terminal of the (3N+2)-th stage of shift register unit is connected to the third clock signal line, and the third clock signal terminal of the (3N+2)-th stage of shift register unit is connected to the first clock signal line; and the first clock signal terminal of a (3N+3)-th stage of shift register unit is connected to the third clock signal line, the second clock signal terminal of the (3N+3)-th stage of shift register unit is connected to the first clock signal line, and the third clock signal terminal of the (3N+3)-th stage of shift register unit is connected to the second clock signal line; N is an integer greater than or equal to 0.

At least one embodiment of the present disclosure also provides a display device, and the display device comprises the gate driving circuit according to any one of the embodiments of the present disclosure.

At least one embodiment of the present disclosure also provides a driving method for driving a shift register unit, and the driving method comprises: in response to the first control signal, providing the input signal to the first node by the input circuit; under control of the level of the first node, outputting the output signal at the output terminal by the output circuit; in response to the second control signal, providing the third control signal to the second node by the second node control circuit to control the level of the second node; and under control of the level of the second node, resetting the first node by the first node control circuit.

For example, in the driving method provided by an embodiment of the present disclosure, the second node control circuit comprises a first control sub-circuit and a second control sub-circuit, and the driving method further comprises: in response to a second clock signal which serves as the second control signal, controlling a level of a third node by the first control sub-circuit; and under control of the level of the third node, outputting a third clock signal, as the third control signal, to the second node, by the second control sub-circuit.

For example, in the driving method provided by an embodiment of the present disclosure, under control of the level of the first node, the output circuit outputs the second clock signal as the output signal.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

Figure 1:
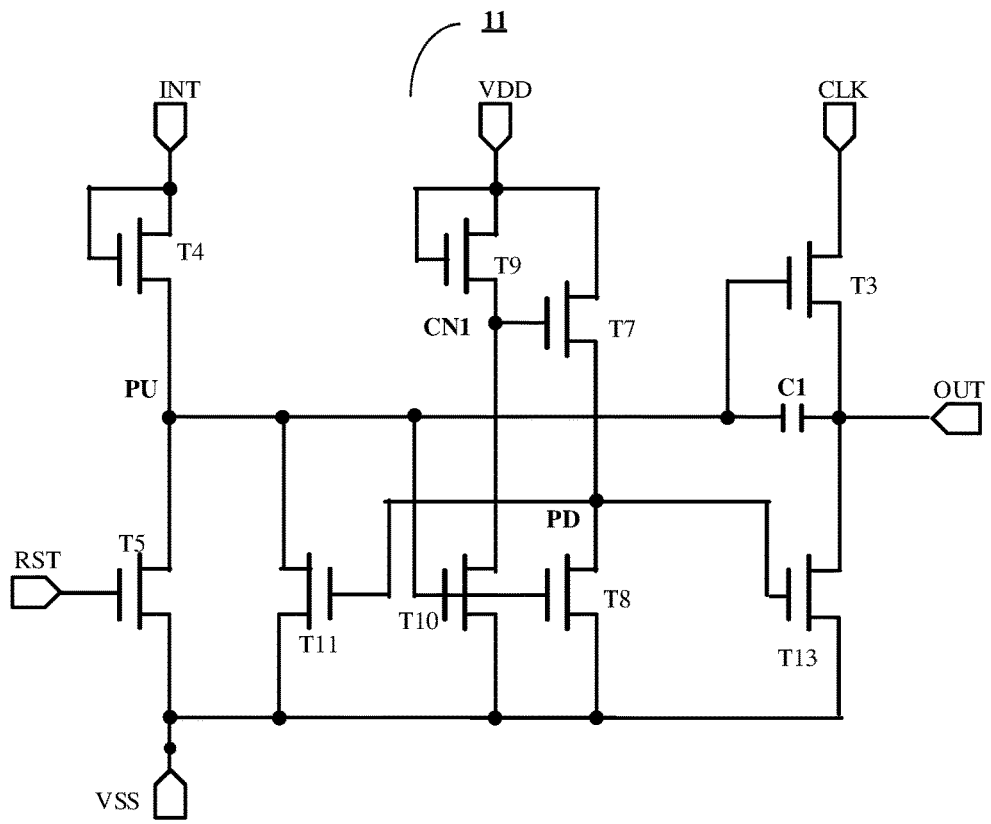
FIG. 1 is a schematic diagram of a circuit structure of a shift register unit.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The present disclosure is described below through several specific embodiments. In order to keep the following description of the embodiments of the present disclosure clear and concise, detailed descriptions of known functions and known components are omitted. In a case where any component of an embodiment of the present disclosure appears in more than one drawing, the component is represented by the same or similar reference numeral in the respective drawings.

In order to reduce a cost of a display device and improve a level of a manufacturing process of the display device, more and more display devices use GOA technology. However, a traditional GOA technology has obvious noise, high power consumption, or the like, due to the complicated circuit design (such as a large number of clock signals and transistors).

For example, FIG. 1 is a schematic diagram of a circuit structure of a shift register unit. A plurality of shift register units can be cascaded to form a gate driving circuit for driving, for example, a liquid crystal display panel or an organic light-emitting diode display panel. As shown in FIG. 1, the shift register unit 11 includes a pull-up node PU and a pull-down node PD. A gate electrode of a pull-down transistor T11 and a gate electrode of a pull-down transistor T13 are connected to the pull-down node PD and are controlled by a level of the pull-down node PD. As shown in FIG. 1, during displaying a frame, the pull-down node PD is at a low level only in a case where a scan signal is output (that is, the pull-up node PU is at a high level), and is at a high level during the rest of the time. Because the pull-down node PD is at a high level for a long time, the pull-down transistors T11 and T13 connected to the pull-down node PD are prone to occur a phenomenon of positive drift of a threshold voltage due to being applied to a positive bias stress for a long time, especially for transistors with an oxide structure, the transistors with an oxide structure is more prone to occur the phenomenon of positive drift. If a positive drift range of the threshold voltage of the transistor is too large, an output of the gate driving circuit is likely to be abnormal, which may cause the display panel to generate an display abnormality phenomenon.

At least one embodiment of the present disclosure provides a shift register unit, and the shift register unit comprises an input circuit, an output circuit, a first node control circuit, and a second node control circuit. The input circuit is connected to a first node, and is configured to provide an input signal to the first node in response to a first control signal; the output circuit is connected to the first node, and is configured to output an output signal at an output terminal under control of a level of the first node; the first node control circuit is connected to the first node and a second node, and is configured to reset the first node under control of a level of the second node; and the second node control circuit is connected to the second node, and is configured to provide a third control signal to the second node in response to a second control signal to control the level of the second node. Embodiments of the present disclosure also provide a gate driving circuit, a display device, and a driving method corresponding to the above-mentioned shift register unit.

The shift register unit provided by the above embodiments of the present disclosure can prevent the second node from being in an active level state for a long time, thereby avoiding a phenomenon that a transistor connected to the second node has a positive drift of the threshold voltage due to a reason that the transistor is subjected to the positive bias stress for a long time, improving the stability and reliability of the gate driving circuit including the shift register unit, and improving the display quality of the display panel.

The embodiments of the present disclosure and examples thereof will be described in detail below with reference to the drawings.

Figure 2:
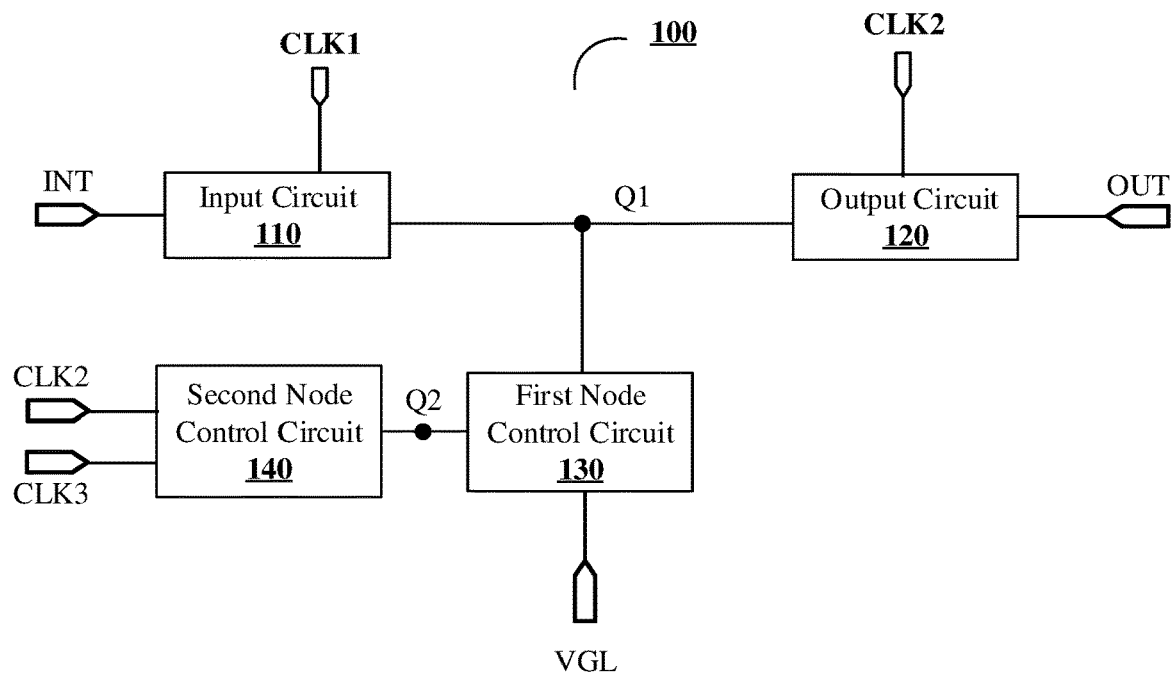
FIG. 2 is a schematic diagram of a shift register unit according to an embodiment of the present disclosure.

FIG. 2 is a schematic diagram of a shift register unit according to an embodiment of the present disclosure. As shown in FIG. 2, the shift register unit 100 includes an input circuit 110, an output circuit 120, a first node control circuit 130, and a second node control circuit 140. A gate driving circuit can be obtained by cascading a plurality of the shift register units 100. The gate driving circuit is used to drive a display panel such as a liquid crystal display panel or an organic light-emitting diode display panel, and sequentially provides scan signals for a plurality of gate lines of the display panel, thereby performing progressive or interlaced scanning and the like in a case where the display panel displays a frame of a picture.

As shown in FIG. 2, the input circuit 110 is connected to a first node Q1 (for example, a pull-up node here), and is configured to input an input signal to the first node Q1 in response to a first control signal, so as to charge the first node Q1. For example, in some examples, the input circuit 110 is connected to a first clock signal terminal CLK1, an input terminal INT, and the first node Q1, and is configured to be turned on under control of a first clock signal received by the first clock signal terminal CLK1, so that the input terminal INT or a separately provided voltage terminal (e.g., a high voltage terminal) is connected to the first node Q1, the input signal provided by the input terminal INT or a high level signal provided by the separately provided voltage terminal is input to the first node Q1 to charge (for example, pull up) a potential of the first node Q1 up to a working potential (active level). For example, in this example, the first clock signal is used as the first control signal, of course, the embodiments of the present disclosure are not limited thereto, and the first clock signal may also be other suitable control signals.

For example, the output circuit 120 is connected to the first node Q1 and an output terminal OUT, and is configured to output an output signal at the output terminal OUT under control of a level of the first node Q1. For example, in some examples, the output circuit 120 is connected to a second clock signal terminal CLK2, the first node Q1, and the output terminal OUT, and is configured to be turned on under control of the level of the first node Q1, transmit a second clock signal provided by the second clock signal terminal CLK2 to the output terminal OUT, and output the second clock signal as the output signal at the output terminal OUT.

The first node control circuit 130 is connected to the first node Q1 and a second node Q2 (for example, in a case where the first node Q1 is a pull-up node, the second node Q2 is a pull-down node), and is configured to reset the first node Q1 under control of a level of the second node Q2. For example, the first node control circuit 120 may be connected to the first node Q1, a reference voltage terminal VGL (for example, providing a low level) or a separately provided voltage terminal (for example, a low voltage terminal), and the second node Q2, so that under control of the level of the second node Q2, the reference voltage terminal VGL or the separately provided voltage terminal can be electrically connected to the first node Q1 to perform pull-down reset on the first node Q1.

The second node control circuit 140 is connected to the second node Q2 and is configured to provide a third control signal to the second node Q2 in response to a second control signal to control the level of the second node Q2. For example, the second node control circuit 140 may be connected to the second clock signal terminal CLK2 and a third clock signal terminal CLK3, and is configured to output a third clock signal provided by the third clock signal terminal CLK3 to the second node Q2 in response to the second clock signal provided by the second clock signal terminal CLK2, so that the level of the second node Q2 is consistent with the third clock signal, thereby avoiding that the second node Q2 is always at a high level during non-output phases and avoiding the positive drift of the threshold voltage of the transistor in the circuit (for example, the first node control circuit 130) controlled by the second node Q2. For example, in an example, the second clock signal CLK2 is used as the second control signal, and the third clock signal CLK3 is used as the third control signal, and the embodiments of the present disclosure are not limited thereto.

The shift register unit provided by the above embodiments of the present disclosure can prevent the second node from being in an active level state for a long time, thereby avoiding a phenomenon that a transistor connected to the second node has a positive drift of the threshold voltage due to a reason that the transistor is subjected to the positive bias stress for a long time, improving the stability and reliability of the gate driving circuit including the shift register units, and improving the display quality of the display panel.

Figure 3:
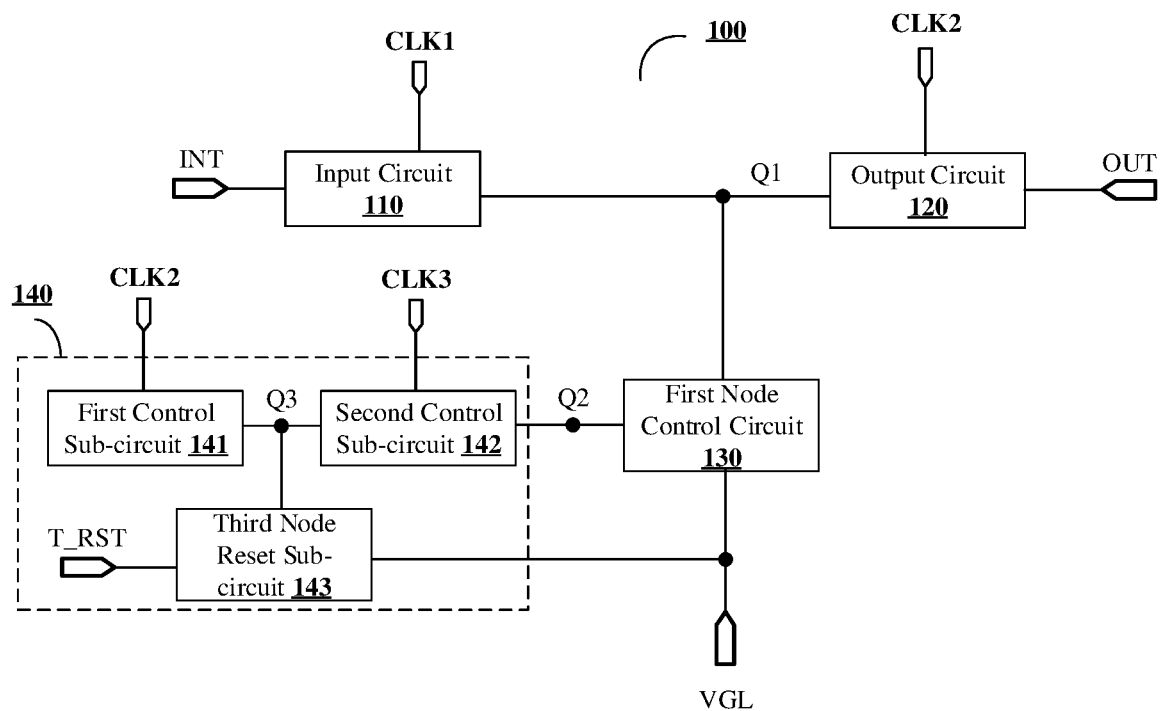
FIG. 3 is a schematic diagram of an example of a second node control circuit as shown in FIG. 2.

FIG. 3 shows a schematic diagram of an example of a second node control circuit as shown in FIG. 2. As shown in FIG. 3, in an example, the second node control circuit 140 includes a first control sub-circuit 141 and a second control sub-circuit 142.

For example, the first control sub-circuit 141 is connected to a third node Q3 and is configured to control a level of the third node Q3 in response to the second clock signal CLK2 which serves as a second control signal. For example, the first control sub-circuit 141 is connected to the second clock signal terminal CLK2 and the third node Q3, and is configured to be turned on under control of the second clock signal provided by the second clock signal terminal CLK2 to pre-charge the third node Q3. For example, in this example, the second control signal includes the second clock signal.

For example, the second control sub-circuit 142 is connected to the second node Q2 and the third node Q3, and is configured to output a third control signal to the second node Q2 under control of the level of the third node Q3. For example, the second control sub-circuit 142 is connected to a third clock signal terminal CLK3, the second node Q2, and the third node Q3, and is configured to be turned on under control of the level of the third node Q3, so as to output a third clock signal provided by the third clock signal terminal CLK3 to the second node Q2, so that the level of the second node Q2 is consistent with the third clock signal, so that the second node Q2 can be prevented from being always at a high level during the non-output phases, so as to avoid the positive drift of the threshold voltage of the transistor in the circuit (for example, the first node control circuit 130) controlled by the second node Q2. For example, in this example, the third control signal includes the third clock signal.

As shown in FIG. 3, in another example, the second node control circuit 140 further includes a third node reset sub-circuit 143. For example, the third node reset sub-circuit 143 is connected to the third node Q3 and is configured to reset the third node Q3 in response to a reset signal. For example, the third node reset sub-circuit 143 is connected to a reset terminal T_RST, the reference voltage terminal VGL or a separately provided voltage terminal (for example, providing a low level), and the third node Q3, and is configured to connect the third node Q3 to the reference voltage terminal VGL or the separately provided voltage terminal under control of the reset signal provided by the reset terminal T_RST, thereby resetting the third node Q3. For example, the reset signal is a main reset signal, and third nodes Q3 of all cascaded shift register units are reset at the same time at a beginning phase or an end phase of a frame display, thereby ensuring the display quality of the display panel.

Figure 4:
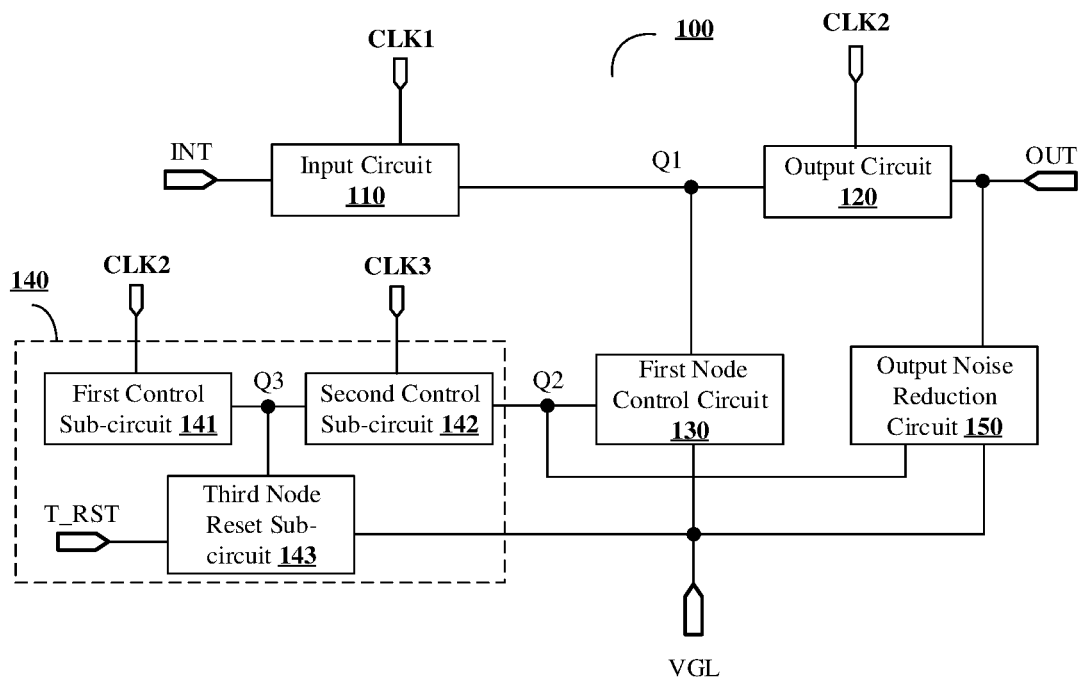
FIG. 4 is a schematic diagram of another shift register unit according to an embodiment of the present disclosure.

FIG. 4 is a schematic diagram of another shift register unit according to an embodiment of the present disclosure. As shown in FIG. 4, based on the shift register unit as shown in FIG. 3, the shift register unit 100 further includes an output noise reduction circuit 150. It should be noted that other circuit structures of the shift register unit 100 as shown in FIG. 4 are basically the same as the shift register unit 100 as shown in FIG. 3, and similar portions are not repeated herein again.

For example, the output noise reduction circuit 150 is configured to perform noise reduction on the output terminal OUT under control of the level of the second node Q2. For example, the output noise reduction circuit 150 is connected to the second node Q2, the output terminal OUT, and the reference voltage terminal VGL or a separately provided voltage terminal (for example, a low voltage terminal), and is configured to be turned on in a case where the second node Q2 is at a high level, so that the output terminal OUT is connected to the reference voltage terminal VGL or the separately provided voltage terminal, so as to achieve to perform noise reduction on the output terminal OUT.

Figure 5:
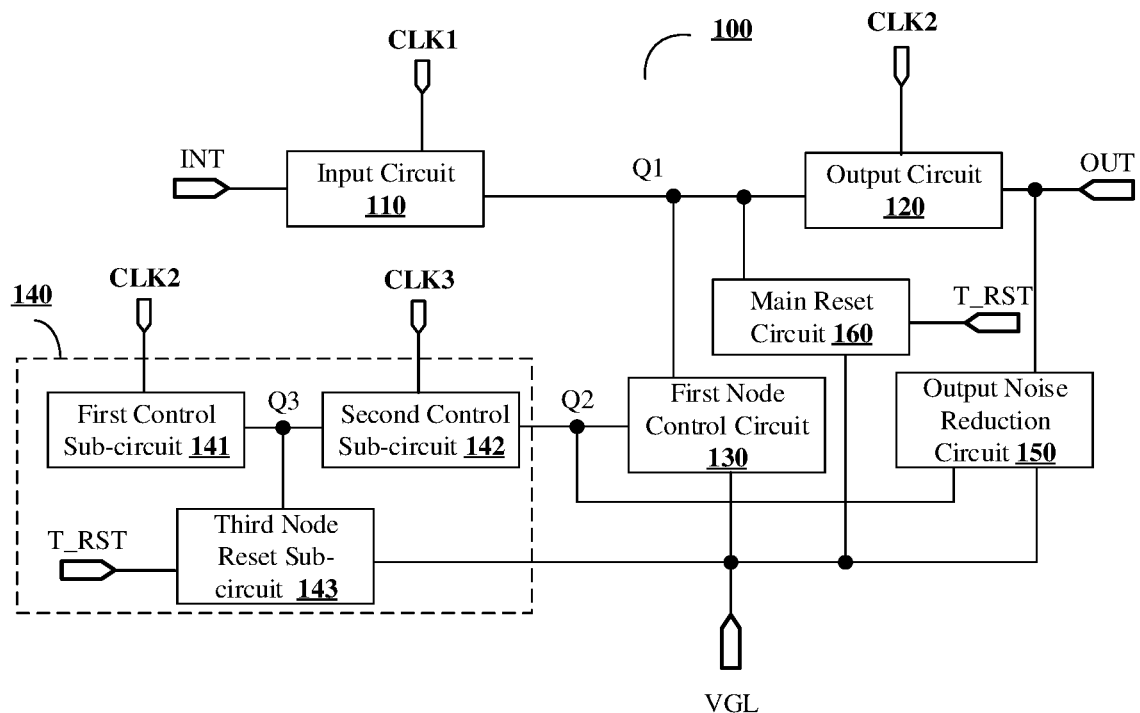
FIG. 5 is a schematic diagram of still another shift register unit according to an embodiment of the present disclosure.

FIG. 5 is a schematic diagram of still another shift register unit according to an embodiment of the present disclosure. As shown in FIG. 5, based on the shift register unit as shown in FIG. 4, the shift register unit 100 further includes a main reset circuit 160. It should be noted that other circuit structures of the shift register unit 100 as shown in FIG. 5 are basically the same as the shift register unit 100 as shown in FIG. 4, and details are not repeated herein again.

For example, the main reset circuit 160 is connected to the first node Q1 and is configured to reset the first node Q1 under control of the reset signal. For example, the main reset circuit 160 is connected to the reset terminal T_RST, the first node Q1, and the reference voltage terminal VGL or a separately provided voltage terminal (e.g., a low voltage terminal), and is configured to be turned on under control of the reset signal provided by the reset terminal T_RST, so as to electrically connect the first node Q1 to the reference voltage terminal VGL or the separately provided voltage terminal (e.g., a low voltage terminal), thereby resetting the first node Q1. For example, a connection line corresponding to the reset terminal T_RST is omitted in the figure.

For example, the reference voltage terminal VGL is configured to provide a DC low level signal (for example, the DC low level signal is lower than or equal to a low level portion of the clock signal), for example, the reference voltage terminal VGL is grounded. The DC low level signal is referred to as a reference voltage herein, this case may be applied to the following embodiments, and similar description will not be repeated again.

Please note that the "active level" in the shift register unit provided in the embodiment of the present disclosure refers to a level that is capable of causing an operated transistor included in the shift register unit to be turned on, and correspondingly, "inactive level" refers to a level at which the operated transistor included in the shift register unit cannot be turned on (i.e., the transistor is turned off). Depending on factors such as a type of transistor (N-type or P-type) in the circuit structure of the shift register unit, the active level may be higher or lower than the inactive level. Generally, for a square wave pulse signal used by the shift register unit during operation, the active level corresponds to a level of a square wave pulse portion of the square wave pulse signal, and the inactive level corresponds to a level of a non-square wave pulse portion of the square wave pulse signal.

Figure 6:
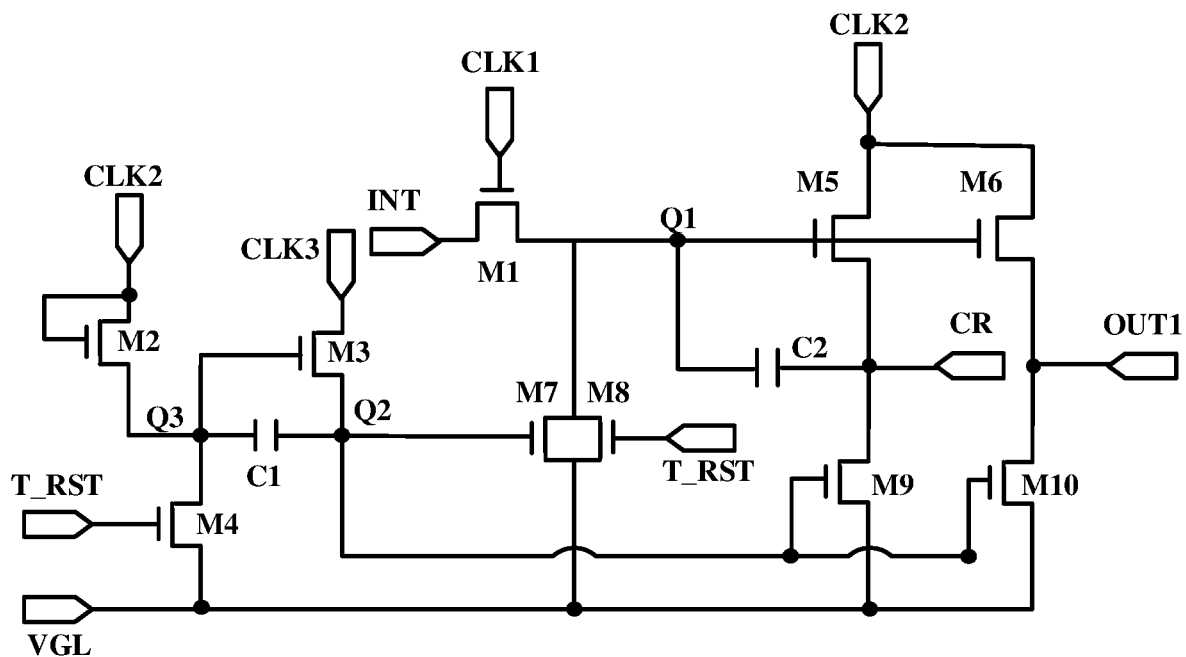
FIG. 6 is a circuit diagram of a specific implementation example of the shift register unit as shown in FIG. 5.

FIG. 6 is a circuit diagram of a specific implementation example of the shift register unit according to the embodiment as shown in FIG. 5, and the shift register units of the embodiments as shown in other figures can be implemented in the same or similar manner. As shown in FIG. 6, the shift register unit 100 includes first to tenth transistors M1-M10, and further includes a first capacitor C1 and a second capacitor C2. It should be noted that, in the following description, the present disclosure is described by taking a case that respective transistors are N-type transistor as an example, but this does not constitute a limitation on the embodiments of the present disclosure.

As shown in FIG. 6, the input circuit 110 may be implemented as a first transistor M1. A gate electrode of the first transistor M1 is connected to the first clock signal terminal CLK1 to receive the first clock signal as the first control signal, a first electrode of the first transistor M1 is connected to the input terminal INT to receive the input signal, a second electrode of the first transistor M1 is connected to the first node Q1, so that in a case where the first transistor M1 is turned on in response to an active level (e.g., a high level signal) of the first clock signal provided by the first clock signal terminal CLK1, the first node Q1 is charged by using the input signal received by the input terminal INT, so that the first node is at a high level.

As shown in FIG. 6, the first control sub-circuit 141 may be implemented as a second transistor M2. A gate electrode and a first electrode of the second transistor M2 are electrically connected to each other, and are respectively configured to be connected to the second clock signal terminal CLK2 to receive the second clock signal as the second control signal, a second electrode of the second transistor M2 is connected to the third node Q3, so that in a case where the second transistor M2 is turned on in response to the second clock signal (e.g., a high level) provided by the second clock signal terminal CLK2, the third node Q3 is charged by using the second clock signal, so that the third node Q3 is at a high level.

The second control sub-circuit 142 may be implemented as a third transistor M3 and a first capacitor C1. A gate electrode of the third transistor M3 is connected to the third node Q3, a first electrode of the third transistor M3 is connected to the third clock signal terminal CLK3 to receive the third clock signal as the third control signal, and a second electrode of the third transistor M3 is connected to the second node Q2. A first terminal of the first capacitor C1 is connected to the second node Q2, and a second terminal of the first capacitor C1 is connected to the third node Q3. In a case where the third node Q3 is at an active level (for example, a high level), the third transistor M3 is turned on, the second node Q2 is connected to the third clock signal terminal CLK3, so that the level of the second node Q2 is consistent with the level of the third clock signal provided by the third clock signal terminal CLK3. For example, in a case where the third clock signal provided by the third clock signal terminal CLK3 is at a high level, the second node Q2 is at a high level; and in a case where the third clock signal is at a low level, the second node Q2 is at a low level, so that the second node Q2 can be prevented from being always at a high level during the non-output phases, thereby avoiding that the transistors (for example, a seventh transistor M7, a ninth transistor M9, and a tenth transistor M10) controlled by the second node Q2 occur the positive drift of the threshold voltage under the effect of the positive bias stress for a long time.

As shown in FIG. 6, the third node reset sub-circuit 143 includes a fourth transistor M4. A gate electrode of the fourth transistor M4 is connected to the reset terminal T_RST to receive the reset signal, a first electrode of the fourth transistor M4 is connected to the third node Q3, and a second electrode of the fourth transistor M4 is connected to the reference voltage terminal VGL to receive the reference voltage. For example, at the beginning or end of a frame display, in a case where the reset signal provided by the reset terminal T_RST is an active level (for example, a high level), the fourth transistor M4 is turned on, so that the third node Q3 is connected to the reference voltage terminal VGL, and therefore, the third node Q3 can be reset.

For example, as shown in FIG. 6, the output terminal OUT includes a shift output terminal CR and at least one scan signal output terminal, so that the output signal such as the second clock signal provided by the second clock signal terminal CLK2 is output to the shift output terminal CR and the at least one scan signal output terminal, respectively, so as to improve the driving capability of the shift register unit 100. For example, at least one scan signal output terminal includes a scan signal output terminal OUT1. For example, the shift output terminal CR is used to provide an input signal for a next stage of shift register unit 100, and the scan signal output terminal OUT1 is used to provide a drive signal for pixel circuits of pixel units in a row in the display panel. For example, the shift output terminal CR and the scan signal output terminal OUT1 output the same output signal. It should be noted that, in other examples, in a case where the shift register unit 100 includes a plurality of scan signal output terminals, the respective scan signal output terminals may also output different output signals. The specific settings of the plurality of scan signal output terminals are determined according to the actual situation and are not limited by the embodiments of the present disclosure.

For example, the output circuit 120 may be implemented as a fifth transistor M5, a sixth transistor M6, and a second capacitor C2. A gate electrode of the fifth transistor M5 is connected to the first node Q1, a first electrode of the fifth transistor M5 is connected to the second clock signal terminal CLK2 to receive the second clock signal as the output signal, and a second electrode of the fifth transistor M5 is connected to the shift output terminal CR. A gate electrode of the sixth transistor M6 is connected to the first node Q1, a first electrode of the sixth transistor M6 is connected to the second clock signal terminal CLK2 to receive the second clock signal as the output signal, and a second electrode of the sixth transistor M6 is connected to the scan signal output terminal OUT1. A first terminal of the second capacitor C2 is connected to the first node Q1, and a second terminal of the second capacitor C2 is connected to the shift output terminal CR or the scan signal output terminal OUT1. It should be noted that, the present disclosure is not limited to this case, the shift register unit may further include more output signals and scan signal output terminals corresponding to the output signals.

As shown in FIG. 6, the first node control circuit 130 may be implemented as a seventh transistor M7. For example, a gate electrode of the seventh transistor M7 is connected to the second node Q2, a first electrode of the seventh transistor M7 is connected to the first node Q1, and a second electrode of the seventh transistor M7 is connected to the reference voltage terminal VGL to receive the reference voltage. For example, in a case where the second node Q2 is at a high level, the seventh transistor T7 is turned on, so that the first node Q1 is connected to the reference voltage terminal VGL to receive the reference voltage, and therefore, the first node Q1 can be reset.

For example, in a case where at least one scan signal output terminal includes one scan signal output terminal, for example, the scan signal output terminal OUT1, for example, the output noise reduction circuit 150 may be implemented as a ninth transistor M9 and a tenth transistor M10. A gate electrode of the ninth transistor M9 is connected to the second node Q2, a first electrode of the ninth transistor M9 is connected to the shift output terminal CR, and a second electrode of the ninth transistor M9 is connected to the reference voltage terminal VGL to receive the reference voltage. A gate electrode of the tenth transistor M10 is connected to the second node Q2, a first electrode of the tenth transistor M10 is connected to the scan signal output terminal OUT1, and a second electrode of the tenth transistor M10 is connected to the reference voltage terminal VGL to receive the reference voltage.

For example, in a case where the second node Q2 is at an active level (for example, a high level), both the ninth transistor M9 and the tenth transistor M10 are turned on, so that the shift output terminal CR and the scan signal output terminal OUT1 are both electrically connected to the reference voltage terminal VGL, thereby performing noise reduction on the shift output terminal CR and the scan signal output terminal OUT1.

It should be noted that, in the embodiments of the present disclosure, in a case where the shift register unit 100 includes a plurality of shift output terminals CR and a plurality of scan signal output terminals OUT1, the output noise reduction circuit 150 also includes a plurality of transistors correspondingly connected to the plurality of shift output terminals and/or the plurality of scan signal output terminals to perform noise reduction on the plurality of shift output terminals and/or the plurality of scan signal output terminals.

For example, the main reset circuit 160 may be implemented as an eighth transistor M8. For example, a gate electrode of the eighth transistor M8 is connected to the reset terminal T_RST to receive the reset signal, a first electrode of the eighth transistor M8 is connected to the first node Q1, and a second electrode of the eighth transistor M8 is connected to the reference voltage terminal VGL to receive the reference voltage. For example, at the beginning or end of a frame display, in a case where the reset signal provided by the reset terminal T_RST is at an active level (e.g., a high level), the eighth transistor M8 is turned on, so that the first node Q1 is connected to the reference voltage terminal VGL, and therefore, the first node Q1 can be reset.

It should be noted that the circuit structures of the shift register units as shown in FIG. 2 to FIG. 4 are similar to the circuit structures, of the shift register units as shown in FIG. 5, as shown in FIG. 6, and are not repeated here again.

In the embodiments of the present disclosure, for example, in a case where each circuit is implemented as N-type transistors, the term "pull-up" represents charging a node or an electrode of a transistor so as to raise an absolute value of a level of the node or the electrode, thereby implementing an operation (e.g., conduction) of the corresponding transistor; and the term "pull-down" represents discharging a node or an electrode of a transistor so as to decrease an absolute value of a level of the node or the electrode, thereby implementing an operation (e.g., turn-off) of the corresponding transistor.

For another example, in a case where each circuit is implemented as P-type transistors, the term "pull-up" represents discharging a node or an electrode of a transistor so as to decrease an absolute value of a level of the node or the electrode, thereby implementing the operation (e.g., conduction) of the corresponding transistor; and the term "pull-down" represents charging a node or an electrode of a transistor so as to raise an absolute value of a level of the node or the electrode, thereby implementing the operation (e.g., turn-off) of the corresponding transistor.

It should be noted that, in the description of each embodiment of the present disclosure, the first node Q1, the second node Q2, and the third node Q3 do not represent components that actually exist, but may represent conjunction points of related electrical connections in the circuit diagram.

It should be noted that, transistors used in the embodiments of the present disclosure may be thin film transistors, field effect transistors, or other switching devices with the same characteristics, and the embodiments of the present disclosure are described by taking a case that the transistors are the thin film transistors as an example. A source electrode and a drain electrode of a transistor used herein may be symmetrical in structures, and therefore the source electrode and the drain electrode of the transistor may be indistinguishable in physical structures. In the embodiments of the present disclosure, in order to distinguish two electrodes of the transistor apart from a gate electrode, one of the two electrodes is directly referred to as a first electrode, and the other of the two electrodes is referred to as a second electrode.

In addition, the transistors in the embodiments of the present disclosure are described by taking a case that transistors are N-type transistors as an example, in this case, the first electrode of the transistor is a drain electrode, and the second electrode is a source electrode. It should be noted that the present disclosure comprises but is not limited thereto. For example, one or more transistors in the shift register unit 100 provided by the embodiments of the present disclosure may also be P-type transistors, in this case, the first electrode of the transistor is a source electrode and the second electrode of the transistor is a drain electrode, as long as the respective electrodes of the selected type transistor are connected correspondingly with reference to the connection manner of the respective electrodes of the corresponding transistor in the embodiments of the present disclosure, and the corresponding voltage terminal is provided with a corresponding high voltage or low voltage. In a case where an N-type transistor is used, Indium Gallium Zinc Oxide (IGZO) can be adopted as an active layer of a thin film transistor, compared to adopt low temperature poly silicon (LTPS) or amorphous silicon (for example, hydrogenation amorphous silicon) as the active layer of the thin film transistor, a size of the transistor can be effectively reduced and the leakage current can be prevented.

Figure 7:
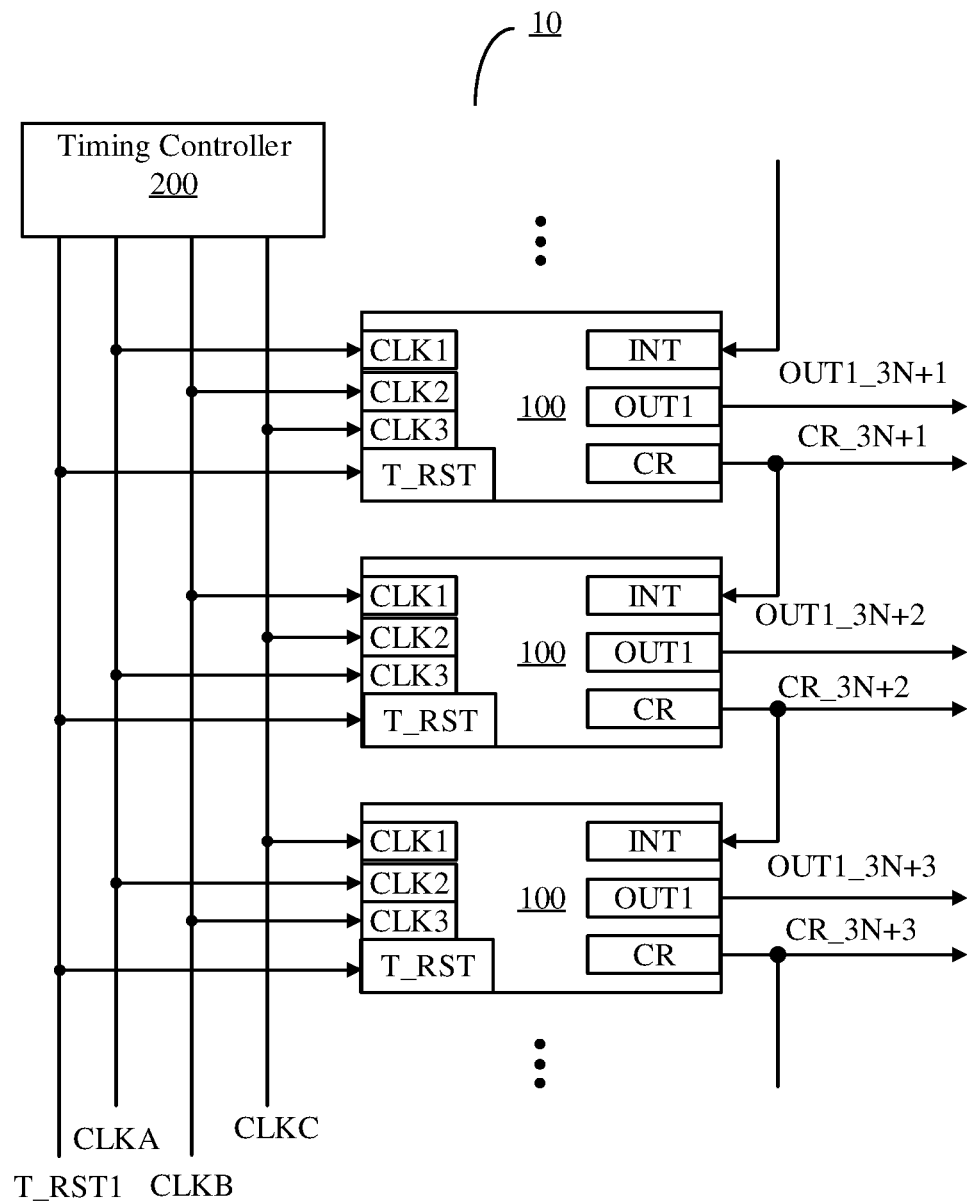
FIG. 7 is a schematic diagram of a gate driving circuit according to an embodiment of the present disclosure.

An embodiment of the present disclosure provides a gate driving circuit. FIG. 7 is a schematic diagram of a gate driving circuit according to an embodiment of the present disclosure. As shown in FIG. 7, the gate driving circuit 10 includes a plurality of shift register units 100 which are cascaded. Any one or more of the plurality of shift register units 100 may adopt a structure or a modification of the shift register unit 100 provided by any one of the embodiments of the present disclosure, for example, may adopt the shift register unit 100 as shown in FIG. 6. For example, the gate driving circuit 10 can be directly integrated on an array substrate of the display device by using the same semiconductor manufacturing process as the thin film transistor, so as to achieve the progressive or interlaced scanning driving function.

Except for a first stage of shift register unit, an input terminal INT of each of the other stages of the shift register units is connected to a shift output terminal CR of a previous stage of shift register unit thereof.

Because the shift register unit provided in the embodiment of the present disclosure can control the first node control circuit 130 and the output noise reduction circuit 150 to be turned on under control of the level of the second node Q2, thereby achieving to reset the first node Q1 and perform noise reduction on the output terminal OUT, so that there is no need to provide a separate reset circuit to reset the first node Q1 of a current stage of shift register unit. Therefore, in the gate driving circuit 10, each stage of shift register unit (in addition to a last stage of shift register unit) does not need to be connected to a shift output terminal CR of a next stage of shift register unit thereof to reset the first node Q1 of the current stage of shift register unit, so that the gate driving circuit provided by the embodiment of the present disclosure can reduce the complexity of wiring and improve the stability of the gate driving circuit.

As shown in FIG. 7, the gate driving circuit 10 further includes a first clock signal line CLKA, a second clock signal line CLKB, and a third clock signal line CLKC. For example, the first clock signal line CLKA, the second clock signal line CLKB, and the third clock signal line CLKC are respectively connected to clock signal terminals of the plurality of cascaded shift register units to provide clock signals. It should be noted that the gate driving circuit 10 may further include four, six, eight or more clock signal lines, and the number of the clock signal lines depends on the specific situation, and is not limited in the embodiments of the present disclosure.

For example, as shown in FIG. 7, each of the plurality of cascaded shift register units further includes a first clock signal terminal CLK1, a second clock signal terminal CLK2, and a third clock signal terminal CLK3, and are respectively configured to be connected to the first clock signal line CLKA, the second clock signal line CLKB, or the third clock signal line CLKC to receive the clock signals. The first clock signal terminal CLK1 of a (3N+1)-th (N is an integer greater than or equal to 0) stage of shift register unit is connected to the first clock signal line CLKA, the second clock signal terminal CLK2 of the (3N+1)-th stage of shift register unit is connected to the second clock signal line CLKB, and the third clock signal terminal CLK3 of the (3N+1)-th stage of shift register unit is connected to the third clock signal line CLKC; the first clock signal terminal CLK1 of a (3N+2)-th stage of shift register unit is connected to the second clock signal line CLKB, the second clock signal terminal CLK2 of the (3N+2)-th stage of shift register unit is connected to the third clock signal line CLKC, and the third clock signal terminal CLK3 of the (3N+2)-th stage of shift register unit is connected to the first clock signal line CLKA; and the first clock signal terminal CLK1 of a (3N+3)-th stage of shift register unit is connected to the third clock signal line CLKC, the second clock signal terminal CLK2 of the (3N+3)-th stage of shift register unit is connected to the first clock signal line CLKA, and the third clock signal terminal CLK3 of the (3N+3)-th stage of shift register unit is connected to the second clock signal line CLKB. It should be noted that, the embodiments of the present disclosure include, but are not limited to, the above-mentioned connection mode.

As shown in FIG. 7, the gate driving circuit 10 further includes a reset signal line T_RST1. Each of the plurality of cascaded shift register units further includes a reset terminal T_RST, and is configured to be connected to the reset signal line T_RST1 to receive the reset signal.

It should be noted that OUT1_3N+1 as shown in FIG. 7 represents the scan signal output terminal of the (3N+1)-th stage of shift register unit, OUT1_3N+2 represents the scan signal output terminal of the (3N+2)-th stage of shift register unit, OUT1_3N+3 represents the scan signal output terminal of the (3N+3)-th stage of shift register unit, and so on; CR_3N+1 represents the shift output terminal of the (3N+1)-th stage of shift register unit, CR_3N+2 represents the shift output terminal of the (3N+2)-th stage of shift register unit, CR_3N+3 represents the shift output terminal of the (3N+3)-th stage of shift register unit, and so on. The reference numerals in the following embodiments are similar to those described herein and will not be described again.

For example, the input terminal INT of the first stage of shift register unit may be configured to receive a trigger signal STV. For simplicity, the trigger signal STV is not shown in FIG. 7.

For example, as shown in FIG. 7, the gate driving circuit 10 may further include a timing controller 200. For example, the timing controller 200 may be configured to be connected to the first clock signal line CLKA, the second clock signal line CLKB, and the third clock signal line CLKC to provide clock signals to respective stages of shift register units; the timing controller 200 may also be configured to be connected to a reset signal line T_RST1 and a reference voltage line (not shown in the figure) to respectively provide a reset signal and a reference voltage to respective stages of shift register units 100. For example, the timing controller 300 may be further configured to provide the trigger signal STV. It should be noted that the phase relationship among the plurality of clock signals provided by the timing controller 200 may be determined according to actual requirements.

Figure 8:
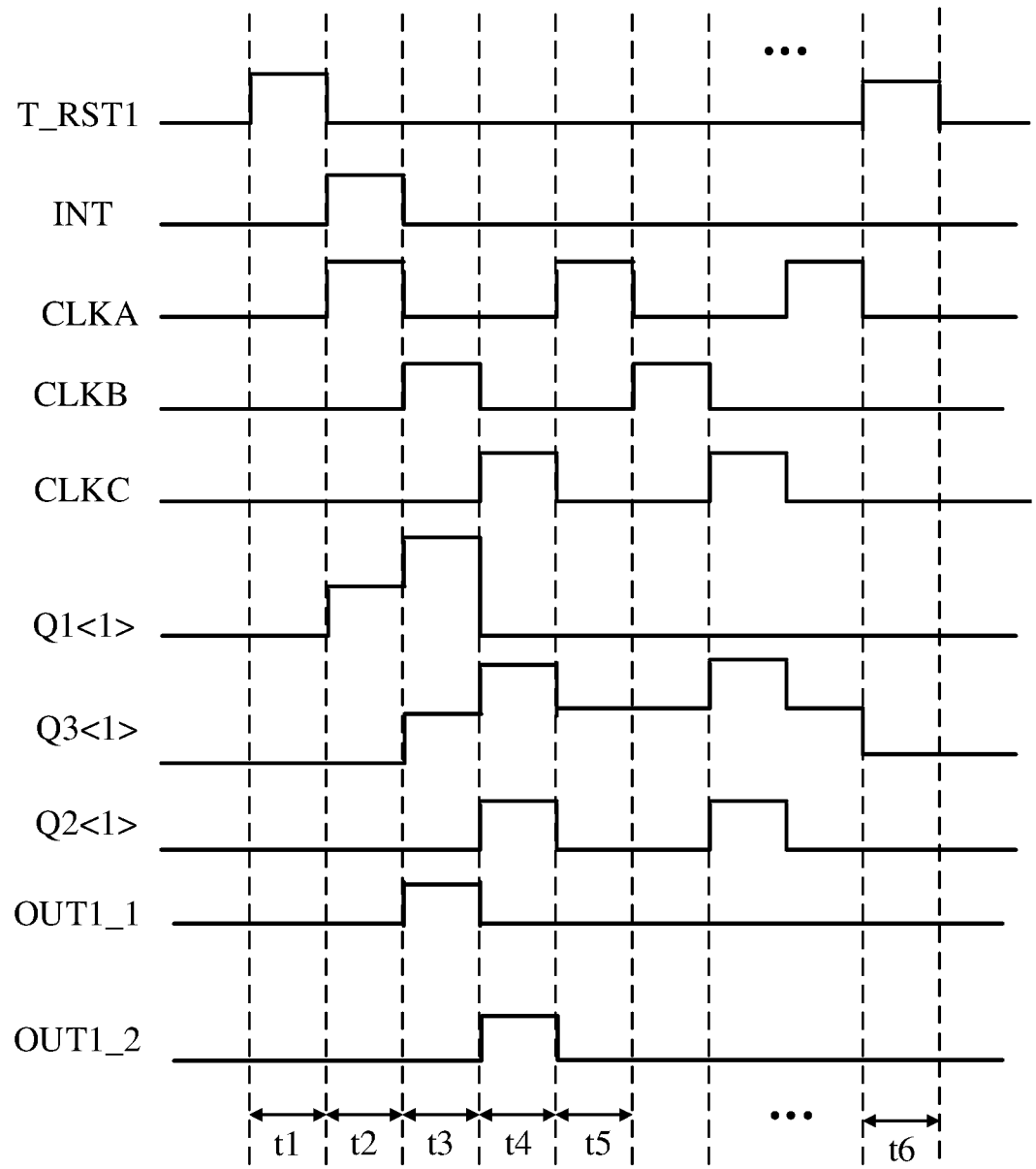
FIG. 8 is a signal timing diagram corresponding to an example in a case where the gate driving circuit as shown in FIG. 7 operates.

For example, the timing of the clock signals provided by the first clock signal line CLKA, the second clock signal line CLKB, and the third clock signal line CLKC may adopt the signal timing as shown in FIG. 8 to implement the function of outputting gate scan signals row by row by the gate driving circuit 10. It should be noted that the potential in the signal timing diagram as shown in FIG. 8 is only schematic, and does not represent the actual potential value or relative proportion, and corresponding to the above examples, a high level signal corresponds to a turn-on signal of an N-type transistor, and a low level signal corresponds to a turn-off signal of the N-type transistor.

For example, in one example, a working principle of the first stage of shift register unit of the gate driving circuit 10 shown in FIG. 7 will be described below with reference to the signal timing diagram shown in FIG. 8.

As shown in FIG. 8, Q1 <1>, Q2 <1>, and Q3 <1> represent a first node, a second node, and a third node in the first stage of shift register unit in the gate driving circuit 10, respectively; OUT1_1 and OUT1_2 respectively represent a scan signal output terminal of the first stage of shift register unit and a scan signal output terminal of a second stage of shift register unit in the gate driving circuit 210. For example, the first stage of shift register unit can adopt the circuit structure as shown in FIG. 6, and the working principle of the shift register unit 100 is describes in the following In a first phase t1 (that is, the beginning phase of a frame), the reset signal line T_RST1 provides a high level, because reset terminals T_RST of the respective stages of shift register units are connected to the reset signal line T_RST1, and therefore, in this phase, main reset circuits 160 and third node reset sub-circuits 143 of the respective stages of shift register units are turned on, so that first nodes Q1 and third nodes Q3 are connected to the reference voltage terminal VGL, thereby performing resetting on the first nodes Q1 and the third nodes Q3 of the respective stages of shift register units. It should be noted that the potential in the signal timing diagram as shown in FIG. 8 is only schematic, and does not represent the actual potential value or relative proportion, and corresponding to the above examples, a high level signal corresponds to a turn-on signal of an N-type transistor, and a low level signal corresponds to a turn-off signal of the N-type transistor.

In a second phase t2, the input terminal INT provides a high level and the first clock signal line CLKA provides a high level, because the first clock signal terminal CLK1 of the first stage of shift register unit 100 is connected to the first clock signal line CLKA, and therefore, in this phase, a high level is input to the first clock signal terminal CLK1 of the first stage of shift register unit 100, and the input circuit 110 is turned on under control of the high level provided by the first clock signal terminal CLK1, so that the high level provided by the input terminal INT charges the first node Q1 <1>, and the first node Q1 <1> is charged to a first high level; and at the same time, the second clock signal line CLKB provides a low level, because the second clock signal terminal CLK2 of the first stage of shift register unit 100 is connected to the second clock signal line CLKB, in this phase, a low level is input to the second clock signal terminal CLK2 of the first stage of shift register unit 100, so that under control of the first high level of the first node Q1 <1>, the low level input from the second clock signal terminal CLK2 is output to the output terminal OUT1_1 of the first stage of shift register unit 100.

In a third phase t3, the second clock signal line CLKB provides a high level, so a high level is input to the second clock signal terminal CLK2 of the first stage of shift register unit 100, the first node Q1 <1> is further charged to a second high level due to the bootstrap effect of the capacitor, and therefore, under control of the second high level of the first node Q1 <1>, the high level input from the second clock signal terminal CLK2 is output to the scan signal output terminal OUT1_1 of the first stage of shift register unit 100; at the same time, the first control sub-circuit 141 is turned on under control of the high level input from the second clock signal terminal CLK2, so that the high level input from the second clock signal terminal CLK2 charges the third node Q3 <1>, and the third node Q3 <1> is charged to the first high level; and meanwhile, the third clock signal line CLKC provides a low level, because the third clock signal terminal CLK3 of the first stage of shift register unit 100 is connected to the third clock signal line CLKC, and therefore, in this phase, a low level is input to the third clock signal terminal CLK3 of the first stage of shift register unit 100, so under control of the first high level of the third node Q3 <1>, the low level input from the third clock signal terminal CLK3 is output to the second node Q2 <1> of the first stage of shift register unit 100. Moreover, in this phase, the third clock signal line CLKC provides a low level, because the second clock signal terminal CLK2 of the second stage of shift register unit 100 is connected to the third clock signal line CLKC, in this phase, a low level is input to the second clock signal terminal CLK2 of the second stage of shift register unit 100, and because the high level output from the first output terminal OUT1_1 of the first stage of shift register unit 100 is used as the input signal of the second stage of shift register unit 100, the first node Q1 of the second stage of shift register unit 100 is pulled up to a first high level by the input signal, and thus, under control of the first high level of the first node Q1 of the second stage of shift register unit 100, the low level input from the second clock signal terminal CLK2 of the second stage of shift register unit 100 is output to the output terminal OUT1_2.

In a fourth phase t4, the third clock signal line CLKC provides a high level, so a high level is input to the third clock signal terminal CLK3 of the first stage of shift register unit 100, the third node Q3 <1> is further charged to the second high level due to the bootstrap effect of the capacitor, therefore, under control of the second high level of the third node Q3 <1>, the high level input from the third clock signal terminal CLK3 is output to the second node Q2 <1> of the first stage of shift register unit 100, so that the first node control circuit 130 and the output noise reduction circuit 150 are turned on under control of the level of the second node Q2 <1>, and thus, the first node Q1 <1>, the shift output terminal CR_1, and the scan signal output terminal OUT1_1 are connected to the reference voltage terminal VGL to achieve noise reduction; and meanwhile, in this phase, because the third clock signal line CLKC provides a high level, a high level is input to the second clock signal terminal CLK2 of the second stage of shift register unit 100, the first node Q1 of the second stage of shift register unit 100 is further charged to a second high level due to the bootstrap effect of the capacitor, so that under control of the second high level of the first node Q1, the high level input from the second clock signal terminal CLK2 of the second stage of shift register unit 100 is output to the output terminal OUT1_2 of the second stage of shift register unit 100.

In a fifth phase t5, the third clock signal line CLKC provides a low level, and therefore, a low level is input to the third clock signal terminal CLK3 of the first stage of shift register unit. Because the second control sub-circuit 142 is turned on in response to the high level of the third node Q3 <1>, the low level input from the third clock signal terminal CLK3 is output to the second node Q2 <1> of the first stage of shift register unit 100, and therefore, in this phase, the second node Q2 <1> is discharged to a low level, so that the level of the second node Q2 <1> is consistent with the level of the third clock signal provided by the third clock signal terminal CLK3, thereby avoiding that the second node Q2 <1> is always at a high level during the non-output phases (that is, the phases except the third phase t3), and avoiding that the transistors (for example, the seventh transistor M7, the ninth transistor M9, and the tenth transistor M10) controlled by the second node Q2 <1> occur the positive drift of the threshold voltage under the effect of the positive bias stress for a long time. In this phase, in a case where the second node Q2 <1> is discharged to a low level, the third node Q3 <1> is also pulled down due to the coupling effect of the capacitor, and for example, is pulled down to the first high level.

It should be noted that the working principles of the remaining stages of the shift register units are similar to the working principle of the first stage of shift register unit and are not repeated here, and the difference is that: except for the first stage of shift register unit, the other stages of the shift register units do not include the first phase t1, that is, the global reset at the beginning of the frame display in not included.

At the end of a frame, that is, in a sixth phase t6, the reset signal line T_RST1 provides a high level, because the reset terminals T_RST of the respective stages of shift register units all are connected to the reset signal line T_RST1, in this phase, the main reset circuits 160 and the third node reset sub-circuits 143 of the respective stages of shift register units are turned on, so that the first nodes Q1 and the third nodes Q3 of the respective stages of shift register units all are connected to the reference voltage terminal VGL, thereby resetting the first nodes Q1 and the third nodes Q3 of the respective stages of shift register units, to avoid erroneous output of the shift register units and improve display quality.

It should be noted that the potential in the signal timing diagram as shown in FIG. 8 is only schematic, and does not represent the actual potential value or relative proportion, and corresponding to the above examples, a high level signal corresponds to a turn-on signal of an N-type transistor, and a low level signal corresponds to a turn-off signal of the N-type transistor.

For example, in a case where the gate driving circuit 10 is used to drive a display panel, the gate driving circuit 10 may be disposed on one side of the display panel. For example, the display panel comprises a plurality of rows of gate lines. The scan signal output terminals of the respective stages of shift register units of the gate driving circuit 10 may be configured to be sequentially connected to the plurality of rows of gate lines for outputting the gate scan signals. It should be noted that, the gate driving circuit 10 can also be provided on both sides of the display panel to achieve bilateral driving. The embodiments of the present disclosure do not limit the arrangement manner of the gate driving circuit 10.

Figure 9:
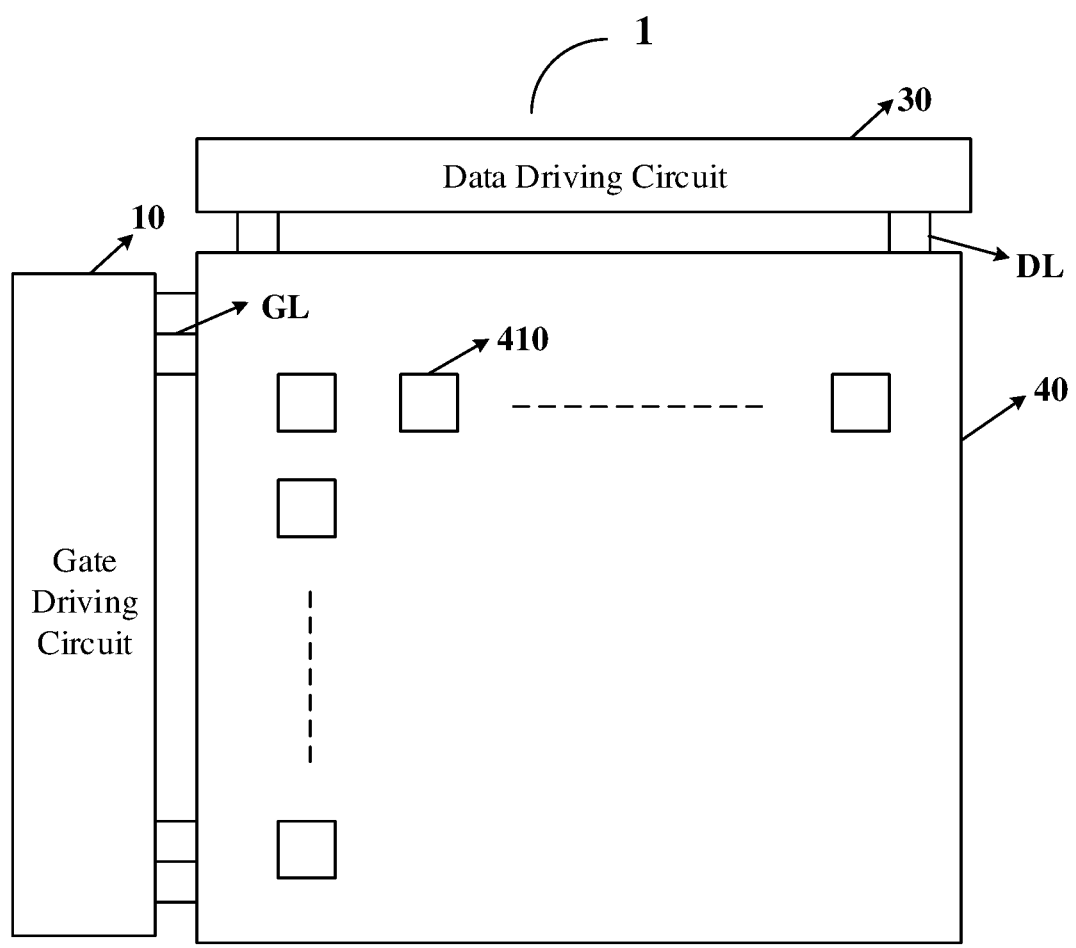
FIG. 9 is a schematic diagram of a display device according to an embodiment of the present disclosure.

An embodiment of the present disclosure further provides a display device 1. As shown in FIG. 9, the display device 1 includes the gate driving circuit 10 provided by the above embodiments of the present disclosure. The display device 1 further includes a display panel 40, and the display panel 40 includes a pixel array including a plurality of sub-pixel units 410. For example, the display device 1 may further include a data driving circuit 30. The data driving circuit 30 is configured to provide data signals to the pixel array; and the gate driving circuit 10 is used to provide drive signals to the pixel array. For example, the drive signals can drive scanning transistors and sensing transistors in the sub-pixel units 410. The data driving circuit 30 is electrically connected to the sub-pixel units 410 through data lines DL, and the gate driving circuit 10 is electrically connected to the sub-pixel units 410 through gate lines GL.

It should be noted that the display device 1 in the embodiments may be a liquid crystal panel, a liquid crystal television, a display, an OLED panel, an OLED television, an electronic paper display device, a mobile phone, a tablet computer, a notebook computer, a digital photo frame, a navigator, or any product or component having a display function. The display device 1 may further include other conventional components such as a display panel, and the embodiments of the present disclosure are not limited thereto.

Technical effects of the display device 1 provided by the embodiments of the present disclosure may refer to the corresponding descriptions of the gate driving circuit 10 in the above embodiments, and details are not described herein again.

It should be noted that, for clarity and conciseness, the entire structure of the display device 1 is not given. In order to implement the necessary functions of the display device, those skilled in the art may set other structures not shown according to specific application scenarios, and the embodiments of the present disclosure do not limit this.

An embodiment of the present disclosure further provides a driving method that can be used to drive the shift register unit 100 provided by the embodiments of the present disclosure. For example, in an example, the driving method includes: in response to the first control signal, providing the input signal to the first node Q1 by the input circuit 110; under control of the level of the first node Q1, outputting the output signal at the output terminal OUT by the output circuit 120; in response to the second control signal, providing the third control signal to the second node Q2 by the second node control circuit 140 to control the level of the second node Q2; and under control of the level of the second node Q2, resetting the first node Q1 by the first node control circuit.

For example, in another example, the second node control circuit 140 includes a first control sub-circuit 141 and a second control sub-circuit 142, and the driving method further includes: in response to a second clock signal which serves as the second control signal, controlling a level of a third node Q3 by the first control sub-circuit 141; under control of the level of the third node Q3, outputting the third clock signal, as the third control signal, to the second node Q2 by the second control sub-circuit 142. For example, in this example, under control of the level of the first node Q1, the output circuit 120 outputs a second clock signal as an output signal.

Technical effects of the driving method of the gate driving circuit 10 provided by the embodiments of the present disclosure may refer to the corresponding description of the gate driving circuit 10 in the above embodiments, and details are not described herein again.

The following statements should be noted:

(1) The accompanying drawings involve only the structure(s) in connection with the embodiment(s) of the present disclosure, and other structure(s) can be referred to common design(s).

(2) In case of no conflict, the embodiments of the present disclosure and the features in the embodiment(s) can be combined with each other to obtain new embodiment(s).

What have been described above are only exemplary implementations of the present disclosure, and are not intended to limit the protection scope of the present disclosure. Therefore, the protection scope of the present disclosure is determined by the appended claims.

What is claimed is:

1. A shift register unit, comprising an input circuit, an output circuit, a first node control circuit, and a second node control circuit,
    wherein the input circuit is connected to a first node, and is configured to provide an input signal to the first node in response to a first control signal;

the output circuit is connected to the first node and an output terminal, and is configured to output an output signal at the output terminal under control of a level of the first node;

the first node control circuit is connected to the first node and a second node, and is configured to reset the first node under control of a level of the second node; and the second node control circuit is connected to the second node, and is configured to provide a third control signal to the second node in response to a second control signal to control the level of the second node.

2. The shift register unit according to claim 1, wherein the input circuit comprises a first transistor, a gate electrode of the first transistor is connected to a first clock signal terminal to receive a first clock signal as the first control signal, a first electrode of the first transistor is connected to an input terminal to receive the input signal, and a second electrode of the first transistor is connected to the first node.

3. The shift register unit according to wherein the second node control circuit comprises a first control sub-circuit and a second control sub-circuit;

the first control sub-circuit is connected to a third node, and is configured to control a level of the third node in response to a second clock signal which serves as the second control signal; and the second control sub-circuit is connected to the second node and the third node, and is configured to output the third control signal to the second node under control of the level of the third node.

4. The shift register unit according to claim 3, wherein the third control signal comprises a third clock signal.

5. The shift register unit according to claim 4, wherein the second control sub-circuit comprises a third transistor and a first capacitor;

a gate electrode of the third transistor is connected to the third node, a first electrode of the third transistor is connected to a third clock signal terminal to receive the third clock signal as the third control signal, and a second electrode of the third transistor is connected to the second node; and a first terminal of the first capacitor is connected to the second node, and a second terminal of the first capacitor is connected to the third node.

6. The shift register unit according to wherein the first control sub-circuit comprises a second transistor;

a gate electrode and a first electrode of the second transistor are electrically connected to each other, and are respectively configured to be connected to a second clock signal terminal to receive the second clock signal as the second control signal, and a second electrode of the second transistor is connected to the third node.

7. The shift register unit according to claim 3, wherein the second node control circuit further comprises a third node reset sub-circuit, the third node reset sub-circuit is connected to the third node, and is configured to reset the third node in response to a reset signal.

8. The shift register unit according to claim 7, wherein the third node reset sub-circuit comprises a fourth transistor, a gate electrode of the fourth transistor is connected to a reset terminal to receive the reset signal, a first electrode of the fourth transistor is connected to the third node, and a second electrode of the fourth transistor is connected to a reference voltage terminal to receive a reference voltage.

9. The shift register unit according to claim 3, wherein under control of the level of the first node, the output circuit outputs the second clock signal as the output signal at the output terminal.

10. The shift register unit according to claim 9, wherein the output terminal comprises a shift output terminal and at least one scan signal output terminal.

11. The shift register unit according to claim 10, wherein the output circuit comprises a fifth transistor, a sixth transistor, and a second capacitor;

a gate electrode of the fifth transistor is connected to the first node, a first electrode of the fifth transistor is connected to a second clock signal terminal to receive the second clock signal as the output signal, and a second electrode of the fifth transistor is connected to the shift output terminal;

a gate electrode of the sixth transistor is connected to the first node, a first electrode of the sixth transistor is connected to the second clock signal terminal to receive the second clock signal as the output signal, and a second electrode of the sixth transistor is connected to the scan signal output terminal; and a first terminal of the second capacitor is connected to the first node, and a second terminal of the second capacitor is connected to the shift output terminal or the scan signal output terminal.

12. The shift register unit according to claim 1, wherein the first node control circuit comprises a seventh transistor, a gate electrode of the seventh transistor is connected to the second node, a first electrode of the seventh transistor is connected to the first node, and a second electrode of the seventh transistor is connected to a reference voltage terminal to receive a reference voltage.

13. The shift register unit according to claim 1, further comprising an output noise reduction circuit, wherein the output noise reduction circuit is connected to the second node and the output terminal, and is configured to perform noise reduction on the output terminal under control of the level of the second node.

14. The shift register unit according to claim 1, further comprising a main reset circuit, wherein the main reset circuit is connected to the first node and is configured to reset the first node under control of a reset signal.

15. A gate driving circuit, comprising a plurality of cascaded shift register units according to claim 1.

16. The gate driving circuit according to claim 15, further comprising a first clock signal line, a second clock signal line, and a third clock signal line, wherein the shift register unit further comprises a first clock signal terminal, a second clock signal terminal, and a third clock signal terminal;

the first clock signal terminal of a (3N+1)-th stage of shift register unit is connected to the first clock signal line, the second clock signal terminal of the (3N+1)-th stage of shift register unit is connected to the second clock signal line, and the third clock signal terminal of the (3N+1)-th stage of shift register unit is connected to the third clock signal line;

the first clock signal terminal of a (3N+2)-th stage of shift register unit is connected to the second clock signal line, the second clock signal terminal of the (3N+2)-th stage of shift register unit is connected to the third clock signal line, and the third clock signal terminal of the (3N+2)-th stage of shift register unit is connected to the first clock signal line; and the first clock signal terminal of a (3N+3)-th stage of shift register unit is connected to the third clock signal line, the second clock signal terminal of the (3N+3)-th stage of shift register unit is connected to the first clock signal line, and the third clock signal terminal of the (3N+3)-th stage of shift register unit is connected to the second clock signal line;

N is an integer greater than or equal to 0.

17. A display device, comprising the gate driving circuit according to claim 15.

18. A driving method for driving the shift register unit according to claim 1, comprising:
- in response to the first control signal, providing the input signal to the first node by the input circuit;
- under control of the level of the first node, outputting the output signal at the output terminal by the output circuit;
- in response to the second control signal, providing the third control signal to the second node by the second node control circuit to control the level of the second node; and
- under control of the level of the second node, resetting the first node by the first node control circuit.

19. The driving method according to claim 18, wherein the second node control circuit comprises a first control sub-circuit and a second control sub-circuit, and the driving method further comprises:
- in response to a second clock signal which serves as the second control signal, controlling a level of a third node by the first control sub-circuit; and
- under control of the level of the third node, outputting a third clock signal, as the third control signal, to the second node, by the second control sub-circuit.

20. The driving method according to claim 19, wherein under control of the level of the first node, the output circuit outputs the second clock signal as the output signal.

* * * * *